United States Patent [19]

Mathews, Jr.

[11] 4,105,938

[45] Aug. 8, 1978

[54] PROPORTIONAL PULSE CONTROLLER

[75] Inventor: Victor M. Mathews, Jr., Leawood, Kans.

[73] Assignee: MKC Electronics Corporation, Kansas City, Kans.

[21] Appl. No.: 716,099

[22] Filed: Aug. 20, 1976

[51] Int. Cl.$^2$ ................... G05B 11/01; G05B 11/28
[52] U.S. Cl. ............................. 318/599; 180/77 H; 318/631; 318/431
[58] Field of Search ............ 180/77 H; 318/599, 628, 318/587, 569, 606, 430–432, 631, 600

[56] References Cited

U.S. PATENT DOCUMENTS

| 3,803,473 | 4/1974 | Stich | 318/599 |
|---|---|---|---|
| 3,814,199 | 6/1974 | Jones | 318/587 |
| 3,870,931 | 3/1975 | Meyers | 318/599 |

Primary Examiner—Robert K. Schaefer
Assistant Examiner—M. K. Mutter
Attorney, Agent, or Firm—D. A. N. Chase

[57] ABSTRACT

An electrical actuator such as a direct current solenoid or motor is energized by a square wave voltage having an amplitude which applies full operating voltage to the actuator during each pulse. The duty cycle of the applied voltage is variable between predetermined minimum and maximum values, the minimum value being sufficiently high to overcome the starting hysteresis of the actuator. The control apparatus has particular application to proportional control systems, such as in the selective operation of dual solenoid, hydraulic control valves. A hand controller is provided with a handle having a center off position and on positions in opposite directions corresponding to the two solenoids. As the handle is moved away from the off position in either direction through an initial, relatively small displacement, a switch is actuated to apply the square wave voltage to the appropriate solenoid. Additional movement by the operator causes the duty cycle to vary from minimum to maximum as desired. The resistance of a phototransistor determines the value of the duty cycle, and is varied by a cam-shaped shutter operated by the controller handle and which is interposed between the phototransistor and a light-emitting diode. The hand controller may be electrically isolated from the actuators through the use of fiber optic light guides to transmit control information. A fail-safe circuit is provided by a missing pulse detector that deenergizes the controlled actuator if a component failure causes a constant driving voltage to be produced.

13 Claims, 8 Drawing Figures

PROPORTIONAL PULSE CONTROLLER

This invention relates to improvements in apparatus for effecting proportional control of electrical actuators such as solenoids and motors.

In the hydraulic systems of various types of industrial and construction equipment, such as machine tools, aerial baskets, bulldozers, cranes and the like, directional control valves are employed which provide hydraulic flow in proportion to a manual lever position. Such valves afford remote proportional control or programming of direction, flow and pressure. Typically, the valve block employs a hydraulic feedback arrangement such that the valve spool will move only in proportion to the applied force. Accordingly, the flow through the valve may be varied by modifying the voltage applied to an actuating solenoid. The force of the armature depends upon the current in the solenoid winding, and the valve spool is in equilibrium when this force corresponds to the opposing pressure acting on the cross sectional area of the spool.

In valves of this type the displacement of the spool or other valve element is proportional to solenoid current. Potentiometers are commonly employed to vary the applied voltage and are operated by a hand control. Potentiometers, however, present some disadvantages in that they are relatively bulky, require periodic cleaning, and generate heat. Since solenoids have a definite dead band before armature motion occurs, the control handle that operates the potentiometer has a corresponding dead range through the zero position.

Furthermore, a serious disadvantage in potentiometer control is that there is no compensation for the starting hysteresis of the solenoid actuator. This produces the dead range discussed above and, once armature motion begins, hysteresis in the magnetic circuit causes control handle settings to be inconsistent, i.e., the same setting of the hand lever in increasing and decreasing directions does not produce the same valve position. Also, being an analog system, a variable voltage type of control is not easily adapted to applications such as in aerial baskets where it is desired to electrically isolate the hand controller from the hydraulic system.

It is, therefore, the primary object of the present invention to provide control apparatus for electricl actuators such as solenoids or motors having current-carrying windings, wherein such apparatus is not subject to the hysteresis problem discussed above.

As a corollary to the foregoing object, it is an important aim of this invention to provide apparatus as aforesaid which applies full, pulsed voltage at all times to the actuator, and in which the duty cycle of the voltage pulses is varied in order to provide the desired proportional control.

Another important object of the present invention is to provide apparatus as aforesaid in which the minimum duty cycle has a sufficiently high value to overcome the starting hysteresis of the actuator, thereby eliminating the dead band before motion occurs.

Still another important object is to provide apparatus as aforesaid wherein proportional control is achieved through the use of a radiation-sensitive element in the pulse generating circuitry, wherein such element has an electrical characteristic that varies in accordance with the radiation received and that determines the value of the duty cycle.

Still another important object of the invention is to provide apparatus as in the preceding object in which the intensity of the radiation that reaches such element is controlled by a shutter operated by the handle of a hand controller which is selectively positioned by the operator.

Furthermore, it is an important object of the present invention to provide control apparatus as aforesaid for controlling the excitation of either one or the other of a pair of electrical actuators, such as in bidirectional proportional valves, wherein the hand controller has a center off position and a handle movable in either of two directions away from the center position to selectively control the delivery of the variable duty cycle voltage pulses to the desired actuator.

Yet another important object is to provide apparatus as aforesaid which is entirely fail safe in the event that a continuous voltage should be applied, in order to prevent a dangerous overcontrol condition.

Additionally, it is an important object of this invention to provide apparatus as aforesaid which is digital in nature and hence adapted to applications requiring the electrical isolation of the hand controller from other components of the system.

Figure 1:
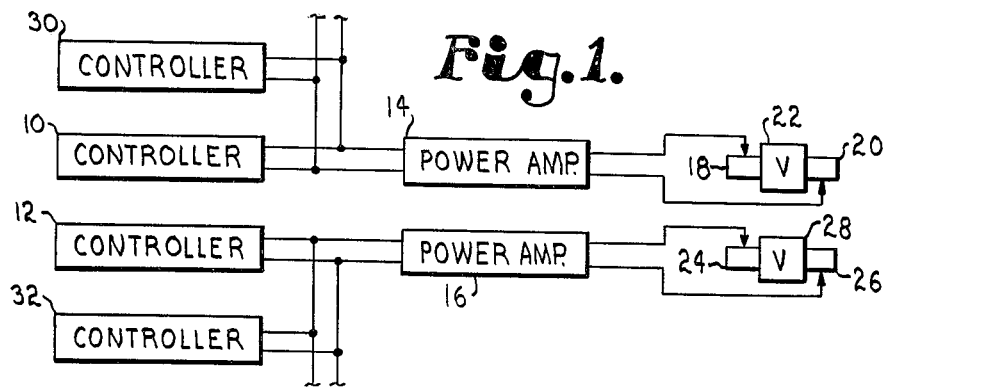
FIG. 1 is a block diagram of the control apparatus of the present invention.

Referring initially to FIG. 1, two primary controller modules 10 and 12 are illustrated connected to the inputs of a pair of power amplifier modules 14 and 16 respectively. The power amplifier 14 has two separate outputs that supply excitation to a corresponding pair of solenoids 18 and 20, the latter being part of a bidirectional, proportional control valve 22. Similarly, the power amplifier 16 has a pair of separate outputs driving solenoids 24 and 26 respectively of a bidirectional control valve 28.

FIG. 1 illustrates that the controller module 10 and the power amplifier module 14 comprise the basic units of the apparatus of the present invention utilized to control an individual proportional valve. Furthermore, another controller module 30 may be employed at a different location with its output simply connected in parallel with the output of the controller module 10. As many controller modules as desired may be used with a single power amplifier depending upon the number of control locations. In identical fashion, an additional controller module 32 is illustrated in parallel with module 12; the controller modules 30 and 32 could, for example, be located at an alternative control location to form a second complete set of controls for the valves 22 and 28. The versatility and expandability of the apparatus is, therefore, readily apparent.

Figures 2, 3, 8:
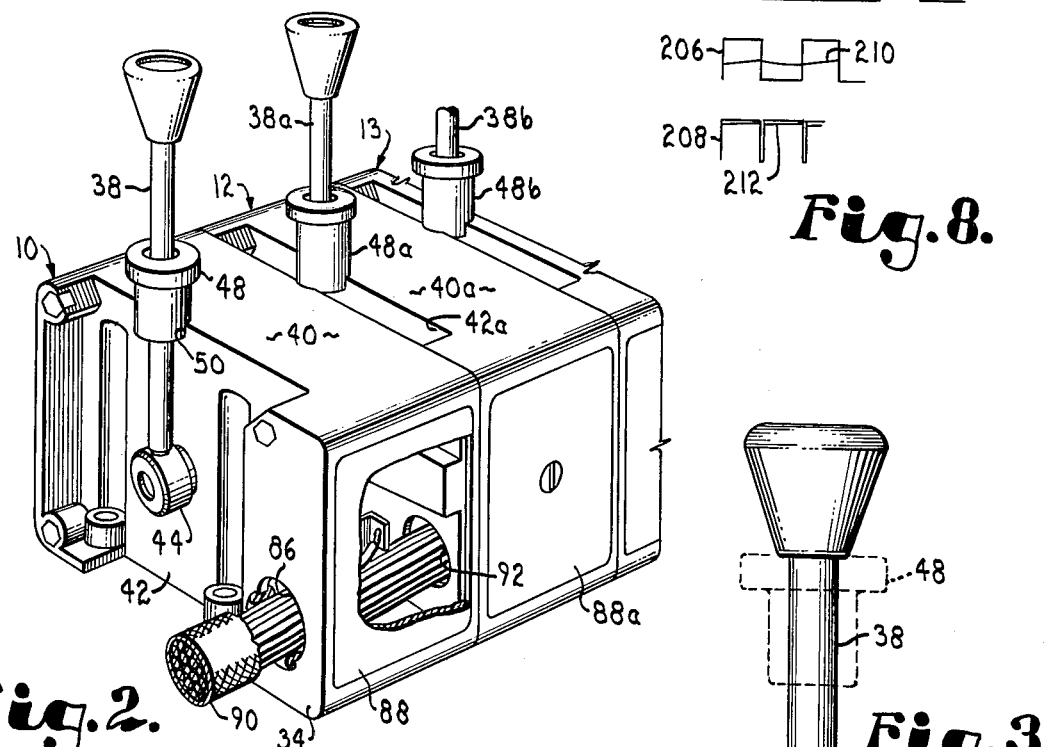
FIG. 2 is a fragmentary, perspective view of a bank of hand controllers.
FIG. 3 is a side elevational view of the hand controller of the present invention, the cover plate being broken away to reveal details of construction and the control handle being illustrated in its center off position.
FIG. 8 is a wave form diagram showing the square wave voltage output and corresponding solenoid current at three different duty cycles.

In FIG. 2 the controller modules 10 and 12 are shown arranged in a bank along with other controller modules such as illustrated fragmentarily at 13. Since each module is identical in construction, only the module 10 will be described in detail herein. Corresponding parts of modules 12 and 13 illustrated in FIG. 2 will be denoted by the same reference numerals with the addition of the "a" and the "b" notation respectively.

Referring to FIGS. 2–6, the controller module 10 has a generally rectangular case 34 which is preferably of plastic construction. In its normal attitude, the case 34 presents a bottom 36 at one longitudinal edge. A control handle 38 projects upwardly through the top 40 of the case 34 and is shown in FIGS. 2 and 3 in its vertical, center off position. The case 34 is recessed at 42 on one face, revealing a hub 44 on a shaft 46. The inner end of the control handle 38 is rigidly secured to the hub 44, and the handle 38 is locked in its off position by a knob 48 of circular cross section received within an arcuate recess in the edge of the top 40.

The shaft 46 extends from the hub 44 through an internal wall 52 within the case 34, an operating member 54 being keyed to the end portion of the shaft opposite the hub 44. The member 54 has a irregular, disc-shaped appearance as is clear in FIGS. 3 and 5 and is provided with an integral hub portion 56 having a flat 58. A spring-loaded return arm 60 is pivotally mounted at 62 at one end thereof and engages the circumferential edge of the hub portion 56, normally across the flat 58 as seen in FIG. 3.

One arcuate edge of the member 54 is inturned to present a flange 64. Being composed of an opaque, preferably plastic material, the flange 64 provides a light shield for a purpose to be described hereinafter. A cam-shaped shutter 66 is carried by the hub portion 56 and is located between the opposite, arcuate margin 68 of the member 54 and the wall 52. A pair of adjustment screws 70 are threaded through the member 54 adjacent the arcuate margin 68 thereof and bear against a web 72 integrally formed with the hub portion 56. The web 72 projects radially outwardly from hub portion 56 (FIG. 6) and is provided with an inturned flange that presents the shutter 66.

A switch is provided by a light emitting diode (LED) 74 and a phototransistor 76 closely spaced therefrom. As may be seen in FIGS. 3 and 5, the LED 74 and the phototransistor 76 are in approximate radial alignment with the axis of the shaft 46, the LED 74 being located within the path of the arcuate flange or shield 64 and the phototransistor 76 being located just outside the shield 64. Likewise, a light emitting diode (LED) hidden from view in FIGS. 3, 5 and 6 (shown at 78 in FIG. 7) and a phototransistor 80 form a second switch controlled by shield 64. The switches 74, 76 and 78, 80 are secured to the wall 52 and, as is clear in FIG. 3, are at opposite ends of the arcuate shield 64 when the operating handle 38 is in its center off position.

Figure 6:
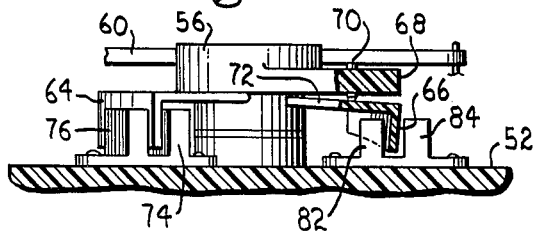
FIG. 6 is a fragmentary, cross-sectional view taken along line 6—6 of FIG. 3, on the same scale as FIG. 4.

A variable resistor is provided by a light emitting diode (LED) 82 and an adjacent phototransistor 84, which are mounted on opposite sides of a narrow gap that receives the arcuate shutter 66 (FIG. 6). When the control handle 38 is in the center off position, the LED 82 and phototransistor 84 are centered with respect to the shutter 66 (FIG. 3) and the widest portion of the shutter is disposed in the gap.

An opening 86 in the side of the case 34 seen in FIG. 2 communicates with a compartment in one end of the case that is normally closed by an end plate 88. A multi-conductor cable 90 extends through opening 86 and into the compartment for the purpose of making appropriate electrical connections (to be discussed) to terminals therein. An aligned opening 92 in the opposite side of the case 34 permits the various leads of the cable 90 to extend into and through the terminal compartments of the other controller modules of the bank (FIG. 2).

Figure 7:
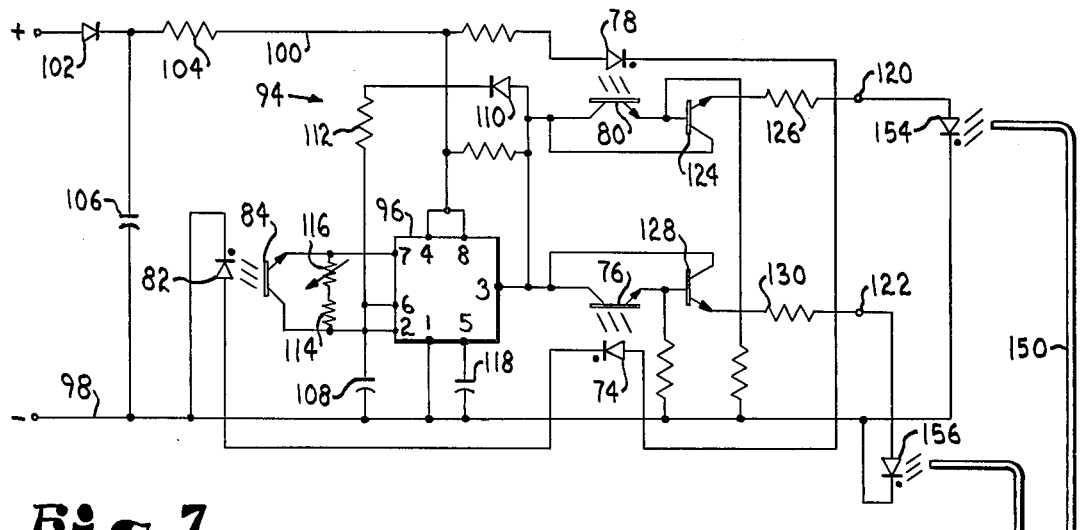
FIG. 7 is an electrical schematic diagram of the pulse generator, power amplifier, and fail-safe circuit.
Figure 7:
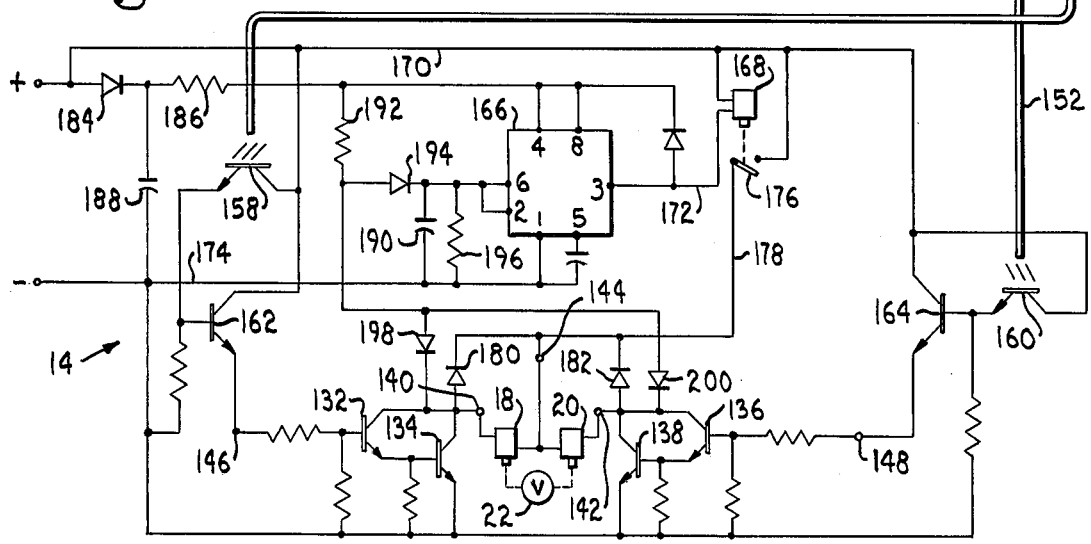

In FIG. 7 a pulse generator circuit 94 is illustrated and employs the previously described LED's 74, 78 and 82 and phototransistors 76, 80 and 84. It is preferred that the pulse generator 94 be physically a part of the controller module 10. Accordingly, the printed circuit board (not shown) containing the pulse generator 94 may be mounted on the inside face of the wall 52 or may be imbedded in the wall structure.

An integrated circuit timer 96 is employed in the pulse generator 94 and has a number of terminals designated by the numerals 1 through 8. Terminal 1 is a ground connection and is directly connected to the negative supply lead 98. Terminal 2 is a trigger input, terminal 3 is the output terminal of the timer 96, terminal 4 is a reset, terminal 5 is a control voltage input, terminal 6 is a threshold input, terminal 7 executes a discharge function, and terminal 8 is connected to the positive supply voltage appearing on lead 100. The particular integrated circuit illustrated herein is manufactured by Signetics, a subsidiary of Corning Glass Works, of Sunnyvale, Cal., and is currently available under the designation NE/SE 555. The timer 96 is operated herein in its astable mode, and is fully described in Normile et al, U.S. Pat. No. 3,864,608, issued Feb. 4, 1975. Such patent is incorporated by reference herein as may be necessary for a full and complete understanding of the circuit configuration and operation of the integrated circuit timer 96.

A polarity protection diode 102 has its anode connected to the + supply terminal, and a series resistor 104 and parallel capacitor 106 provide a filter in the event of sudden voltage changes in the direct current supply (typically a battery in vehicular equipment).

The trigger input 2 and the threshold input 6 of the timer 96 are interconnected, a capacitor 108 being connected between such terminals and the negative supply lead 98. The capacitor 108 is charged and discharged through independent circuits, the charging circuit being traceable from the output terminal 3 to the capacitor 108 via a diode 110 and a series-connected resistor 112. The discharging circuit from capacitor 108 is through the combination of resistors 114 and 116 and phototransistor 84 to the discharge terminal 7 of the integrated circuit timer 96. Note that resistor 116 is variable and is connected in series with resistor 114, such series resistors being in parallel with the emitter-collector circuit of phototransistor 84. Terminals 4 and 8 are tied to the positive supply lead 100, and a noise bypass capacitor 118 is connected between terminal 5 and the negative lead 98.

A square wave output appears at terminal 3 of timer 96 as the voltage at such terminal alternates between positive and negative (ground) levels. The output from terminal 3 is fed to either an output connection 120 or an output connection 122 by conduction of phototransistors 80 and 76 respectively. An NPN transistor 124 is connected with phototransistor 80 in a Darlington configuration, the output wave form being delivered by the emitter of transistor 124 which is connected to the output connection 120 by a resistor 126. Similarly, an NPN transistor 128 is connected with phototransistor 76 in a Darlington configuration and feeds output connection 122 via resistor 130.

The power amplifier module 14 is shown in the lower half of FIG. 7 and has two sets of NPN power transistors 132, 134 and 136, 138 connected as Darlington amplifiers to provide sufficient output drive for operating the two solenoids 18 and 20 respectively. The collectors of transistors 132 and 134 are connected to a first output terminal 140, and the collectors of transistors 136 and 138 are connected to a second output terminal 142. The solenoid 18 is connected across terminal 140 and a common output terminal 144, and solenoid 20 is connected across terminals 142 and 144.

The power amplifier has two inputs 146 and 148 corresponding to the two amplifier sections (Darlington amplifiers 132, 134 and 136, 138). Pulse information from the pulse generator circuit 94 is transmitted to the amplifier inputs 146 and 148 by a pair of glass fiber optic light guides 150 and 152 respectively. A light emitting diode (LED) 154 is connected across output connection 120 and the negative supply lead 98, and an LED 156 is connected across output connection 122 and lead 98. Light flashes from the LED's 154 and 156 produced by the pulse output are received by the light guides 150 and 152 and conducted to respective phototransistors 158 and 160 in the power amplifier module 14. An NPN transistor 162 is connected with the photo transistor 158 in a Darlington configuration, the emitter of transistor 162 being connected to the input 146. Similarly, an NPN transistor 164 is connected with phototransistor 160 in a Darlington configuration and feeds the input 148. It should be understood that the LED's 154 and 156, light guides 150 and 152, and Darlington transducers 158, 162 and 160, 164 may be replaced by a pair of leads (not shown) from output connections 120 and 122 to inputs 146 and 148, respectively, in applications not requiring electrical isolation between the controller module 10 and the power amplifier module 14. When the light guides 150 and 152 are utilized, they may be included in the leads of cable 90 (FIG. 2).

The power amplifier module 14 also includes a failsafe circuit which is provided by an integrated circuit 166 connected as a missing pulse detector. The integrated circuit 166 is identical to that as shown at 96 in the pulse generator 94 and described above, except that the discharge terminal 7 is not used. In normal operation the output terminal 3 of integrated circuit 166 is sinked to negative (ground) to maintain a relay coil 168 energized via a circuit from the + supply terminal, along a lead 170 to coil 168, and thence along a lead 172 to terminal 3. The negative side of the direct current supply is represented by the "−" terminal to which a return lead 174 is connected. Accordingly, the relay coil 168 normally maintains its associated relay switch 176 closed to connect the common output terminal 144 to the positive lead 170 via a lead 178. Diodes 180 and 182 connected between output terminals 140 and 142 and the lead 178 serve as voltage suppressors across the respective solenoids 18 and 20 and allow the solenoid inductive current to flow during the off condition of the amplifier.

The power amplifier module 14 is provided with a polarity protection diode 184 and a supply filter (resistor 186 and capacitor 188), the same as in the pulse generator 94. A capacitor 190 is connected between interconnected terminals 2 and 6 of integrated circuit 166 and the common lead 174. The capacitor 190 is charged from the supply voltage through a resistor 192 and a diode 194, and is discharged through a resistor 196 connected in parallel with capacitor 190. The junction of resistor 192 and diode 194 is connected by diodes 198 and 200 to the collectors of the Darlington amplifiers 132, 134 and 136, 138 respectively.

OPERATION

The on time of the pulse generator 94 is fixed by the value of resistor 112 in the charging circuit to capacitor 108. In applications as illustrated herein where the control apparatus of the present invention is used to control solenoid valves, an on time (pulse width) of from 12 to 16 milliseconds is preferred. The off time is variable and is proportional to the time constant of phototransistor 84, resistors 114 and 116, and capacitor 108. Accordingly, the discharging circuit for the capacitor 108 determines the pulse spacing and, therefore, the duty cycle of the output voltage pulses delivered to an individual solenoid at the output terminals 140 or 142 of the power amplifier.

Figures 4, 5:
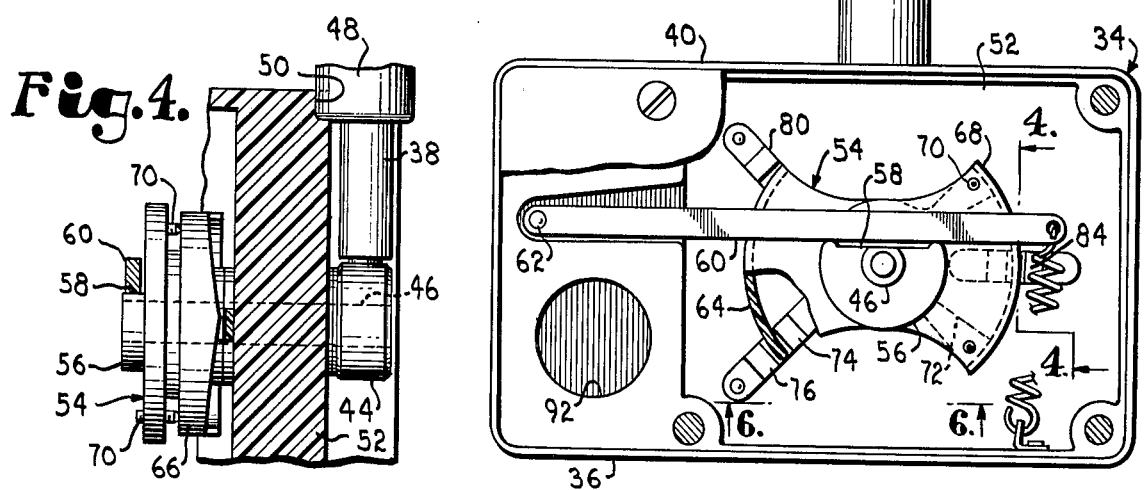
FIG. 4 is an enlarged, fragmentary, cross-sectional view taken along line 4—4 of FIG. 3.
FIG. 5 is a fragmentary view similar to FIG. 3, and illustrates the control handle after its initial displacement (full lines)
Figure 5:
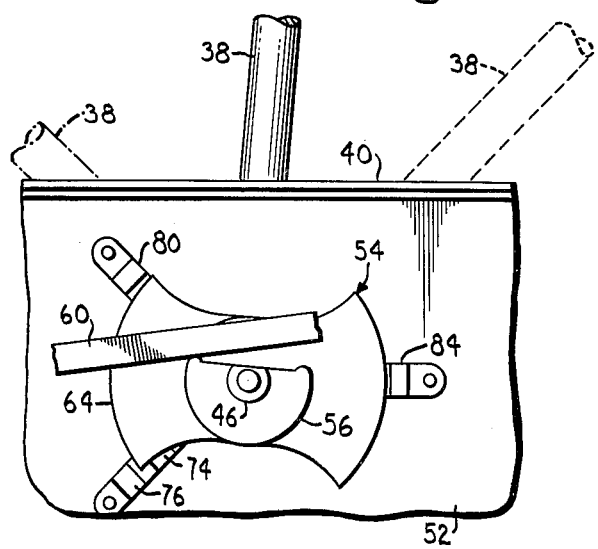

The pulse generator 94 is in continuous operation but no output reaches either of the output connections 120 or 122 so long as the control handle 38 is in the center off position shown in FIGS. 2-4. The opaque shield 64 blocks the light rays from LED's 74 and 78 and prevents the phototransistors 76 and 80 from conducting. Note in FIG. 7 that all three LED's 74, 78 and 82 of the pulse generator are connected in series from the positive lead 100 to the negative lead 98 and thus are in continuous operation.

The shutter 66 likewise prevents conduction of phototransistor 84 when the control handle 38 is in the off position. Note in FIG. 4 that the shape of the shutter 66 is symmetrical, being widest at the center and tapering toward both ends. The screws 70 permit precise adjustment of the shutter 66 in the gap between the LED 82 and the phototransistor 84, since the web 72 is somewhat flexible and resiliently yields when pressure is applied by the screws 70 (FIG. 6).

Since the resistors 114 and 116 are in parallel with the phototransistor 84, there will always be a certain, maximum resistance between terminals 2, 6 and 7 of the integrated circuit timer 96. Therefore, the maximum off time is limited in order to establish a minumum duty cycle of the pulse train. This is illustrated in FIG. 8 by the wave form 202 which represents a 25 percent duty cycle. The minimum duty cycle is selected so as to have a value sufficient to overcome the starting hysteresis of the solenoid (or other actuator such as a direct current motor in other applications).

In FIG. 5 the control handle 38 is shown in full lines after being rotated through an initial displacement of 5 degrees. At this point the shield 64 is sufficiently removed from between the LED 74 and the phototransistor 76 to cause the latter to conduct. This effectively switches terminal 3 of the timer 96 to the output connection 122 and closes the circuit therebetween; accordingly, the LED 156 now responds to the output pulses.

The pulse information from the LED 156 is applied to the input terminal 148 to operate the corresponding section of the power amplifier (Darlington amplifier 136, 138). Full operating voltage is applied to the solenoid 20 during each pulse. Referring to FIG. 8 and visualizing the wave form 202 as representing the applied voltage, the resulting solenoid current is shown at 204. The current wave form 204 has a sawtoothed shape because of the solenoid inductance and the diode suppression, increasing during each voltage pulse and decreasing between pulses. The amplitude of this current is proportional to the duty cycle. It may be seen, therefore, that the solenoid 20 is energized with sufficient current to cause the armature to move, immediately upon closure of the switch formed by the LED 74 and the phototransistor 76. Similarly, this very same action occurs with respect to the solenoid 18 when the control handle 38 is moved 5 degrees in the opposite direction to close the switch formed by LED 78 and phototransistor 80.

Regardless of the direction of movement of the control handle 38, the shield 64 maintains the unoperated switch in the off condition since it remains in the light gap throughout the throw of the handle 38 (which is 45° in either direction from the off position as illustrated in phantom lines in FIG. 5). However, due to the tapered configuration of the shutter 66, the phototransistor 84 begins to conduct and progressively increases in conductivity as the handle 38 is moved away from center. This decreases the resistance of the combination of resistors 114 and 116 and phototransistor 84, thereby decreasing the discharge time of the capacitor 108 and decreasing the off time of the pulse generator 94. Accordingly, the duty cycle of the output wave form increases in value in proportion to the displacement of the control handle 38 as illustrated in FIG. 8 by the wave form 206 (50 percent duty cycle) and the wave form 208 (95 percent duty cycle). The solenoid current likewise increases as shown at 210 and 212. The wave form 208 represents the maximum duty cycle occurring at the full on, 45° position of the control handle 38.

It is anticipated that the desired value for the minimum duty cycle will vary from application to application. Accordingly, the resistor 116 in the pulse generator circuitry 94 is made variable. By being able to set a minimum duty cycle value, and hence a value of starting current at the beginning of the range of control movement of the handle 38, the solenoid or other actuator is responsive to the controller over this entire range (from 5 degrees to 45 degrees of handle movement).

The controller has the advantage of being relatively simple mechanically, and controller modules may be readily assembled in a bank as illustrated in FIG. 2. The control handle 38 of the module 10 is held in its off position by the locking knob 48 which is received within the arcuate recess or notch 50 in the top 40 of the case 34. The other control handles 38a and 38b are likewise held by their locking knobs, and each is released as illustrated in FIG. 3 by simply manually raising the locking knob until it is clear of the case. The recess 42 permits the handle 38 to clear the case when the modules are arranged side by side as shown; note the slot for handle 38a defined by the recess 42a and the abutting side of the case 34 of module 10.

Referring to FIG. 7, the fail-safe circuit in the power amplifier module 14 will deenergize an operating solenoid if a steady voltage is applied to either input 146 or 148 or if either of the output terminals 140 or 142 has a low resistance path to the negative (−) supply terminal. In the absence of a fault condition, the output terminal 3 of integrated circuit 166 is sinked to negative (ground) and relay coil 168 is energized. This maintains relay switch 176 closed. Terminal 3 remains in this state as long as the voltage at terminals 2 and 6 remains above one-third of the supply voltage. (Reference may be made to the aforesaid U.S. Pat. No. 3,864,608 for an understanding of the internal operational details of the integrated circuit 166.) The voltage at terminals 2 and 6 is the voltage across capacitor 190, which is charged from the supply voltage through resistor 192 and diode 194. The capacitor 190 is discharged through resistor 196, the latter having an ohmic value much greater than resistor 192. Accordingly, if neither amplifier section is conducting, diodes 198 and 200 will see an open circuit and capacitor 190 will charge very rapidly through resistor 192 and diode 194. However, when either amplifier section is in the conductive state, capacitor 190 cannot charge and will, instead, begin to discharge through resistor 196. Should either amplifier section remain in the conductive state long enough to allow capacitor 190 to discharge below one-third supply voltage, output terminal 3 of the integrated circuit 166 will go to a positive voltage level and relay coil 168 will be deenergized. This opens relay switch 176 and removes positive voltage from the common output terminal 144, thereby preventing energization of either of the solenoids 18 or 20. So long as either amplifier section continues to conduct, the unit remains in a fail-safe condition. If conduction ceases, the voltage across capacitor 190 will rise and, when it reaches two-thirds supply voltage, output terminal 3 of the integrated circuit 166 will go low and reenergize the relay coil 168 to restore voltage to the common output terminal 144. It may be appreciated, therefore, that the duty cycle of the output voltage wave form must be less than 100 percent or the fail-safe circuit will disconnect the common output terminal 144 from positive voltage.

Having thus described the invention, what is claimed as new and desired to be secured by Letters Patent is:

1. Apparatus for controlling the excitation of an electrical actuator such as a solenoid or motor having a current-carrying winding, said apparatus comprising:

output terminal means adapted to be connected to said actuator for supplying electrical excitation thereto;

circuitry for producing a train of output voltage pulses and delivering said pulses to said terminal means, each of said pulses having an amplitude selected to apply a desired, full operating voltage to said actuator, said circuitry including control means for varying the duty cycle of said pulse train between a predetermined minimum and maximum, said predetermined minimum having a value sufficient to overcome the starting hysteresis of said actuator; and a controller having an off condition and an on condition and, in said on condition, providing a range of excitation for said actuator from said minimum to said maximum duty cycle, said controller including switch means coupled with said circuitry for selectively effecting delivery or interruption of delivery of said pulse train to said terminal means, and a shiftable operating member associated with said switch means and said control means and having an off position corresponding to said off condition of the controller, said member operating the switch means to effect delivery of said pulse train to said terminal means when the member is shifted in a direction corresponding to the on condition of the controller, and selectively operating said control means to set the duty cycle of said pulse train at a desired level of excitation dependent upon the degree of displacement of the member in said direction away from said off position, said controller further including means mounting said member for movement away from said off position through an initial, relatively small displacement to operate said switch means, and through a range of control movement thereafter to selectively operate said control means.

2. The apparatus as claimed in claim 1, wherein said control means includes a radiation-sensitive element having an electrical characteristic that varies in accordance with the radiation received and that determines the value of the duty cycle, a source of said radiation, and a shutter carried by said operating member for movement across a path of said radiation from said source to said element to selectively vary said electrical characteristic.

3. The apparatus as claimed in claim 2, wherein said shutter has means for continuously varying the amount of said radiation received by said element as the shutter moves across said path to progressively increase the value of the duty cycle from said predetermined minimum to said predetermined maximum as said member is shifted through said range of control movement thereof.

4. Apparatus as claimed in claim 1, wherein said circuitry comprises a pulse generator provided with said control means and operable to produce a series of pulses variable in duty cycle between said predetermined minimum and maximum, a radiation-emitting device responsive to said series of pulses for producing corresponding flashes of radiation, a radiation-sensitive transducer capable of converting said flashes into electrical pulse information, a light guide extending from said device to said transducer for conveying said flashes thereto, and an amplifier responsive to the pulse information from said transducer for producing said train of output voltage pulses, and wherein said switch means of the controller is connected with said pulse generator, whereby the controller and pulse generator are electrically isolated from said amplifier and output terminal means.

5. Apparatus as claimed in claim 1, wherein said circuitry further includes a fail-safe circuit coupled with said output terminal means and responsive to the absence of pulses in the excitation delivered to the terminal means for disabling said circuitry to interrupt said delivery of excitation, whereby to prevent an overcontrol condition in the event that a fault causes a steady voltage to be delivered to the terminal means rather than said pulse train.

6. Apparatus for controlling the excitation of either one or the other of a pair of electrical actuators such as solenoids or motors having current-carrying windings, said apparatus comprising:

first output terminal means adapted to be connected to a first of said actuators for supplying electrical excitation thereto;

second output terminal means adapted to be connected to a second of said actuators for supplying electrical excitation thereto;

circuitry for producing a train of output voltage pulses and delivering said pulses to either of said first and second terminal means, each of said pulses having an amplitude selected to apply a desired, full operating voltage to the energized actuator, said circuitry including control means for varying the duty cycle of said pulse train between a predetermined minimum and maximum, said predetermined minimum having a value sufficient to overcome the starting hysteresis of said actuators; and a controller having an off condition and a pair of on conditions corresponding to said pair of actuators and, in either of said on conditions, providing a range of excitation for the energized actuator from said minimum to said maximum duty cycle, said controller including switch means coupled with said circuitry for selectively effecting delivery of said pulse train to either said first or said second terminal means, and a bidirectionally shiftable operating member associated with said switch means and said control means and having a central off position corresponding to said off condition of the controller, said member operating the switch means to effect delivery of said pulse train to said first terminal means when the member is shifted in a first direction corresponding to one of the on conditions of the controller, and selectively operating said control means to set the duty cycle of said pulse train at a desired level of excitation dependent upon the degree of displacement of the member in said first direction away from said off position, said member operating the switch means to effect delivery of said pulse train to said second terminal means when the member is shifted in a second direction corresponding to the other on condition of the controller, and selectively operating said control means to set the duty cycle of said pulse train at a desired level of excitation dependent upon the degree of displacement of the member in said second direction away from said off position, said controller further including means mounting said member for movement in either of said directions away from said off position through an initial, relatively small displacement to operate said switch means, and through a range of control movement thereafter to selectively operate said control means.

7. The apparatus as claimed in claim 6, wherein said controller further includes means mounting said member for limited rotation in said first and second directions away from said central off position, said member being provided with means for operating said switch means upon movement of the member away from said off position in either direction through said initial, relatively small displacement, and wherein said control means includes a radiation-sensitive element having an electrical characteristic that varies in accordance with the radiation received and that determines the value of the duty cycle, a source of said radiation, and a shutter carried by said member for movement across a path of said radiation from said source to said element to selectively vary said electrical characteristic upon further rotative movement of the member in either direction beyond said initial displacement through said range of control movement.

8. The apparatus as claimed in claim 7, wherein said shutter has means for continuously varying the amount of said radiation received by said element as the shutter moves across said path to progressively increase the value of the duty cycle from said predetermined minimum to said predetermined maximum as said member is shifted through said range of control movement thereof in either direction.

9. The apparatus as claimed in claim 7, wherein said switch means comprises first and second light-operated, circuit opening and closing devices for controlling the delivery of said pulse train to respective first and second terminal means, and wherein said switch operating means includes an opaque shield carried by said member and disposed to operate said first and second devices upon rotation of said member in said first and second directions respectively, and maintain the unoperated device in its open circuit condition throughout said initial displacement and range of control movement of the member corresponding to the operated device.

10. Apparatus for controlling the excitation of an electrical actuator such as a solenoid or motor having a current-carrying winding, said apparatus comprising:

output terminal means adapted to be connected to said actuator for supplying electrical excitation thereto;

circuitry for producing a train of output voltage pulses and delivering said pulses to said terminal means, each of said pulses having an amplitude selected to apply a desired, full operating voltage to said actuator, said circuitry including a variable time constant control circuit for varying the duty cycle of said pulse train between a predetermined minimum and maximum, said predetermined minimum having a value sufficient to overcome the starting hysteresis of said actuator; and a controller having an off condition and an on condition and, in said on condition, providing a range of excitation for said actuator from said minimum to said maximum duty cycle, said control circuit comprising a capacitor, resistor means coupled with said capacitor and including a radiation-sensitive element having an electrical resistance that varies in accordance with the radiation received and that determines the value of said duty cycle between said minimum and said maximum, and a source of said radiation, said circuitry further including generator-driver means responsive to the resistance of said element for delivering said pulse train to said terminal means when said controller is in its on condition, said controller including switch means coupled with said circuitry for selectively effecting delivery or interruption of delivery of said pulse train to said terminal means, a shiftable operating member having an off position corresponding to said off condition of the controller, and a shutter associated with said control circuit and carried by said operating member for movement across a path of said radiation from said source to said element to selectively vary the resistance of said element upon movement of the operating member, and hence the shutter, in a direction corresponding to the on condition of the controller to set the duty cycle of said pulse train at a desired level of excitation dependent upon the degree of displacement of the member in said direction away from said off position.

11. Apparatus for controlling the excitation of either one or the other of a pair of electrical actuators such as solenoids or motors having current-carrying windings, said apparatus comprising:

first output terminal means adapted to be connected to a first of said actuators for supplying electrical excitation thereto;

second output terminal means adapted to be connected to a second of said actuators for supplying electrical excitation thereto;

circuitry for producing a train of output voltage pulses and delivering said pulses to either of said first and second terminal means, each of said pulses having an amplitude selected to apply a desired, full operating voltage to the energized actuator, said circuitry including a variable time constant control circuit for varying the duty cycle of said pulse train between a predetermined minimum and maximum, said predetermined minimum having a value sufficient to overcome the starting hysteresis of said actuators; and a controller having an off condition and a pair of on conditions corresponding to said pair of actuators and, in either of said on conditions, providing a range of excitation for the energized actuator from said minimum to said maximum duty cycle, said control circuit comprising a capacitor, resistor means coupled with said capacitor and including a radiation-sensitive element having an electrical resistance that varies in accordance with the radiation received and that determines the value of said duty cycle between said minimum and said maximum, and a source of said radiation, said circuitry further including generator-driver means responsive to the resistance of said element for delivering said pulse train when said controller is in either of its on conditions, said controller including switch means coupled with said circuitry for selectively effecting delivery of said pulse train to either said first or said second terminal means, a bidirectionally shiftable operating member associated with said switch means and having a central off position corresponding to said off condition of the controller, and a shutter associated with said control circuit and carried by said operating member for movement across a path of said radiation from said source to said element to selectively vary the resistance of said element upon movement of the operating member, and hence the shutter, in either a first direction or a second direction corresponding to the respective on conditions of the controller to set the duty cycle of said pulse train at a desired level of excitation dependent upon the degree of displacement of the member in either of said directions away from said off position, said member operating the switch means to effect delivery of said pulse train to said first terminal means when the member is shifted in said first direction corresponding to one of the on conditions of the controller, and operating the switch means to effect delivery of said pulse train to said second terminal means when the member is shifted in said second direction corresponding to the other on condition of the controller.

12. The apparatus as claimed in claim 11, wherein said controller further includes means mounting said member for limited rotation in said first and second directions away from said central off position, and wherein said member is provided with means for operating said switch means upon movement of the member away from said off position in either direction through an initial, relatively small angular displacement, said shutter selectively operating said control circuit upon further rotative movement of the member in either direction through a range of control movement.

13. The apparatus as claimed in claim 12, wherein said controller further includes a control handle connected with said member for rotating the same.

* * * * *